(12) United States Patent
Chang et al.

(10) Patent No.: US 9,312,006 B2
(45) Date of Patent: Apr. 12, 2016

(54) NON-VOLATILE TERNARY CONTENT-ADDRESSABLE MEMORY WITH RESISTIVE MEMORY DEVICE

(71) Applicant: National Tsing Hua University, HsinChu (TW)

(72) Inventors: Meng-Fan Chang, Hsinchu (TW); Ching-Hao Chuang, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 0 days.

(21) Appl. No.: 14/294,174

(22) Filed: Jun. 3, 2014

(65) Prior Publication Data

US 2015/0348629 A1 Dec. 3, 2015

(51) Int. Cl.
*G11C 15/00* (2006.01)
*G11C 15/04* (2006.01)
*G11C 5/06* (2006.01)
*G11C 13/00* (2006.01)

(52) U.S. Cl.
CPC ............... *G11C 15/046* (2013.01); *G11C 5/06* (2013.01); *G11C 13/0002* (2013.01)

(58) Field of Classification Search
USPC ................................. 365/49.17, 148
See application file for complete search history.

(56) References Cited

U.S. PATENT DOCUMENTS

2013/0054886 A1* 2/2013 Eshraghian et al. .......... 711/108
2014/0153310 A1* 6/2014 Sekar et al. ................ 365/49.15

FOREIGN PATENT DOCUMENTS

JP 2013200920 * 10/2013

* cited by examiner

*Primary Examiner* — Hoai V Ho
(74) *Attorney, Agent, or Firm* — Chih Feng Yeh; Huntington IP Consulting Co., Ltd.

(57) ABSTRACT

A scheme for non-volatile ternary content-addressable memory with resistive memory device is proposed. The non-volatile ternary content-addressable memory comprises five transistors including a pair of search transistors with a first search transistor and a second search transistor, a read transistor, a write transistor and a match line transistor, wherein a match line is coupled to the match line transistor; and a pair of variable resistances have a first variable resistance and a second variable resistance. The pair of search transistors is coupled to the pair of variable resistances.

13 Claims, 3 Drawing Sheets

NON-VOLATILE TERNARY CONTENT-ADDRESSABLE MEMORY WITH RESISTIVE MEMORY DEVICE

TECHNICAL FIELD

The present invention is generally relevant to a memory, specifically, a non-volatile ternary content-addressable memory with resistive memory device.

BACKGROUND

Content addressable memory (CAM) is a type of computer memory utilized in high speed searching applications. Most CAM devices utilize static random access memory (SRAM) as data storage devices (utilizing transistors to store memory), and additional transistors and complementary transistors for match operations. Often in these CAM devices search-line access elements and word-line access elements are necessary to operate and program individual memory cells in the memory arrays. These search-line access elements and word-line access elements are often comprised of power intensive large drive field effect transistors (FET).

Content Addressable Memory (CAM) devices are used in applications requiring matching operation on bit patterns, such as table lookup applications used by routing and switching systems in computer network applications. Typically, CAM devices provide for the direct comparison of stored data entries with a supplied value to be compared, called a comparand, in a single access. In contrast, when using conventional Random Access Memory (RAM) for the same search operation, stored data entries are compared by supplying the address of each of the stored data entries to the RAM device, retrieving each of the data entries stored at each of the addresses, and passing the data to an arithmetic logic unit (ALU), where it is then compared to the comparand. CAM devices, on the other hand, allow the comparand to be directly compared with all the stored data entries simultaneously, and any stored data entries matching the input entry generate a match signal. More specifically, each bit position of the comparand is compared with the corresponding bit positions of data entries stored in the CAM device. A priority encoder in the CAM device identifies which matching data entry is output first in the case of multiple matching data entries, with this data entry being termed the highest priority match, as will be explained later in this document.

A conventional Ternary Content Addressable Memory (TCAM) cell can store three states, including a logic "0", logic "1" and a "don't care". TCAM function includes writing data to storage cell in write operation, comparing input data with memory content (all data in storage cell) and outputting the address of identical (matching) content in search operation. The "X" bit means always match. There are 3 kinds of data for 1 bit, "0", "1" and "X" (don't care). A TCAM is grouped into several array segments, and each segment contains an array of TCAM cell pairs. Each TCAM cell pair is a bit and contains a storage cell and a don't-care cell. The storage value of each bit may be a "0" state, an "1" state or an "X" state that is also called don't-care state. One terminal of the storage cell connects to an electrical power source for receiving a voltage, and the other terminal connects to the ground for discharging.

A conventional TCAM cell structure is for example 16 T & 12 T SRAM-based TCAM which includes storage part (6 T or 4 T SRAM) and compare part (nand or nor logic). Please refer to "A ternary content-addressable memory (TCAM) based on 4 T static storage and including a current-race sensing scheme", JSSC, 2003.

A TCAM may be in read operation, write operation and search operation or standby mode. And, it is not necessary to compare the storage data of a bit with the inquiry data when "X" state is set. In conventional TCAM cell, write operation is similar with that of SRAM, described as below table. In search operation of TCAM cell, search-data pair and storage-data pair connect to compare logic (nand or nor) which will discharge matching line (ML) if search-data pair is different from storage-data pair.

| Data | (SRAM1, SRAM2) |
| --- | --- |
| 0 | (1, 0) |
| 1 | (0, 1) |
| X | (0, 0) |

The storage cell still connects to between the electrical power source and the ground via a charging terminal and a discharging terminal, respectively, and that will be accompanied by a leakage current. The leakage current consumes the electrical power and furthermore decreases the device reliability, so the leakage current must be reduced to as small as possible. Moreover, read disturb probably happen when large voltage stress on non-volatile memory (NVM) or large current thru NVM.

The time needed to discharge the match line varies depending on the number of mismatched cells. To minimize the discharge speed variation, larger sized transistors are needed. This, however, results in larger size TCAM cells. Therefore, a discharge speed difference also negatively affects the density of a TCAM.

Accordingly, the technique of reducing the leakage current and read disturb for TCAM has been developed. In view of the foregoing, a need exists for a content addressable memory cell that is stably operable at low operation voltage, low power consumption, and facilitates manufacture of a high density CAM. Thus, the invention's scheme and method are proposed.

SUMMARY

To address the above shortcomings, a non-volatile ternary content-addressable memory 5T2R cell with resistive voltage-divider search is proposed.

One feature of the invention is proposed a non-volatile ternary content-addressable memory with 5T2R cell structure, comprising five transistors including a pair of search transistors with a first search transistor and a second search transistor, a read transistor, a write transistor and a match line transistor, wherein a match line is coupled to the match line transistor; and a pair of variable resistances have a first variable resistance and a second variable resistance. A second terminal of the pair of variable resistances is coupled to the read transistor, the write transistor and the match line transistor. A first terminal of the first variable resistance is coupled to the first search transistor, and wherein a first terminal of the second variable resistance is coupled to the second search transistor.

As above described, a first terminal of the first variable resistance is coupled to a source electrode of the first search transistor. A first terminal of the second variable resistance is coupled to a source electrode of the second search transistor. The drain of the pair of search transistors is coupled to a relatively high voltage. The first search transistor is coupled to a first input signal. The second search transistor is coupled to a second input signal. The second terminal of the pair of variable resistances is coupled to a drain electrode of the read transistor. The second terminal of the pair of variable resistances is coupled to a drain electrode of the write transistor. The second terminal of the pair of variable resistances is coupled to a gate electrode of the match line transistor. A gate electrode of the read transistor is coupled to a third input signal. A gate electrode of the write transistor is coupled to a fourth input signal. A source electrode of the read transistor and a source electrode of the write transistor are coupled to a relatively low voltage.

According to an aspect of the invention, method of search operation for a non-volatile ternary content-addressable memory with 5T2R cell, comprising a step of applying a precharge signal to pre-charge a match line from a relatively low voltage to a working voltage. Then, a relatively high voltage is applied to one of a pair of search transistors via a search line or search line bar during one cycle. When a voltage level at a node prior to a gate of a match line transistor is larger than a threshold voltage of the match line transistor, a mismatch occurs; when the voltage level at the node prior to the gate of the match line transistor is smaller than the threshold voltage of the match line transistor, a match occurs.

The working voltage is VDD. The match line transistor is turned on to discharge the match line when the mismatch occurs. The match line is coupled to the match line transistor. The pair of search transistors is coupled to a pair of variable resistances.

BRIEF DESCRIPTION OF THE DRAWINGS

The attached specifications and drawings outline the preferred embodiments of the invention, including the details of its components, characteristics and advantages.

DETAILED DESCRIPTION

Next, the preferred embodiments of the invention are described in further detail. Notably, however, the preferred embodiments are provided for illustration purposes rather than for limiting the use of the invention. The invention is also applicable in many other embodiments besides those explicitly described, and the scope of the invention is not expressly limited except as specified in the accompanying claims.

The cell structure and cell operation of TCAM are proposed.

In general, TCAM architecture includes (a). array: all storage cells (1 row as 1 entry, 1 column as 1 bit), (b). DEC (Decoder): choose which row to write, (c). MC (Main control): produce control signals, (d). Din (Data in): write data or search data, (e). SA (sense amplifier): sense compared result and amplify the result, (f). OE (Output encoder): transfer SA results into address which has matching data.

Figure 1:
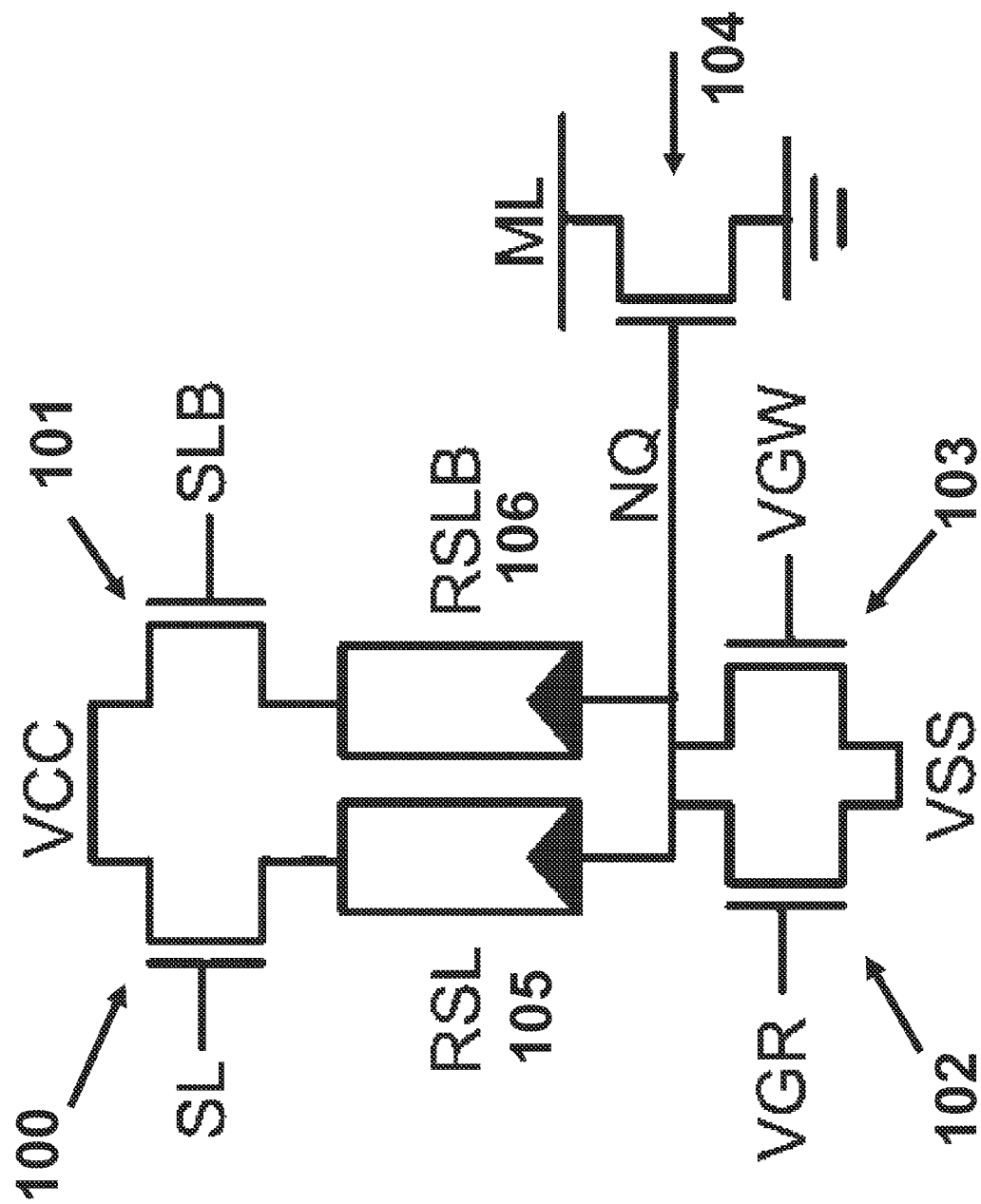
FIG. 1 shows a scheme of an embodiment of a non-volatile ternary content-addressable memory with resistive memory device (5T2R cell) according to the invention.

FIG. 1 shows a scheme of an embodiment of a non-volatile ternary content-addressable memory with resistive memory device (5T2R cell) according to the invention. The non-volatile ternary content-addressable memory with 5T2R cell is a storage unit (cell). FIG. 1 depicts a typical memory cell in a 5T2R arrangement that may benefit from the use of the embodiments. A non-volatile ternary content addressable memory (TCAM) cell is shown in FIG. 1. The non-volatile ternary content-addressable memory with 5T2R cell indicates that each cell includes five transistors and a pair of (two) variable resistances. The five transistors are transistor (MSL) 100, transistor (MSLB) 101, transistor (MRD) 102, transistor (MW) 103, and transistor (MML) 104. The two variable resistances are variable resistance (RSL) 105, and variable resistance (RSLB) 106. Thus, the TCAM operates with resistive voltage-divider search by the variable resistance (RSL) 105, variable resistance (RSLB) 106. The variable resistance (RSL) 105 is coupled to transistor (MSL) 100, transistor (MRD) 102, transistor (MW) 103, and transistor (MML) 104, respectively. The variable resistance (RSLB) 106 is coupled to transistor (MSLB) 101, transistor (MRD) 102, transistor (MW) 103, and transistor (MML) 104, respectively. In one embodiment, transistor (MSL) 100, transistor (MSLB) 101, transistor (MRD) 102, transistor (MW) 103, and transistor (MML) 104 are n-channel metal oxide silicon field effect transistors (NMOS). One (first) terminal of the variable resistance (RSL) 105 is coupled/connected to a source electrode of the transistors (MSL) 100; another (second) terminal of the variable resistance (RSL) 105 is coupled/connected to a drain electrode of the transistor (MRD) 102, a drain electrode of the transistor (MW) 103, and coupled/connected to a gate electrode of the transistor (MML) 104 via/at a node (NQ), respectively. One terminal of the variable resistance (RSLB) 106 is coupled/connected to a source electrode of the transistors (MSLB) 101; another terminal of the variable resistance (RSLB) 106 is coupled/connected to the drain electrode of the transistor (MRD) 102, the drain electrode of the transistor (MW) 103, and coupled/connected to the gate electrode of the transistor (MML) 104 via/at the node (NQ), respectively. That is, second terminal of pair of variable resistances is coupled to the node (NQ), the drain electrode of the transistor (MRD) 102 and a source electrode of the transistor (MW) 103. Node (NQ) is coupled to the gate electrode of the transistor (MML) 104.

Gate electrode of the transistor (MSL) 100 is coupled/connected to a first input signal for a search line (SL), the source electrode of the transistor (MSL) 100 is coupled/connected to a relatively low voltage, and a drain electrode of the transistor (MSL) 100 is coupled/connected to a relatively high voltage (VCC). Gate electrode of the transistor (MSLB) 101 is coupled/connected to a second input signal for a search line bar (SLB), the source electrode of the transistor (MSLB) 101 is coupled/connected to a relatively low voltage, and the drain electrode of the transistor (MSLB) 101 is coupled/connected to the relatively high voltage (VCC). The relatively high voltage (VCC) is an input voltage by the circuit for search transistors. The transistor (MSL) 100 and the transistor (MSLB) 101 are search transistors for search operation. Drain electrode of the pair of search transistors is coupled to relatively high voltage (VCC).

Gate electrode of the transistor (MRD) 102 is coupled/connected to a third input signal (gate voltage for read: VGR), and the source electrode of the transistor (MRD) 102 is coupled/connected to a relatively low voltage (VSS). The transistor (MRD) 102 is a read transistor for search operation and read operation. Gate electrode of the transistor (MW) 103 is coupled/connected to a fourth input signal (gate voltage for write: VGW), and the source electrode of the transistor (MW) 103 is coupled/connected to the relatively low voltage (VSS). The transistor (MW) 103 is a write transistor for write operation only. In general, the relatively low voltage (VSS) is ground voltage. The drain electrode of the transistor (MRD) 102 and the transistor (MW) 103 is coupled/connected to a relatively high voltage.

Drain electrode of the transistor (MML) 104 is coupled/connected to a match line (ML), and the source electrode of the transistor (MML) 104 is coupled/connected to the ground voltage. The match line (ML) indicates whether search-data (pair) matched storage-data (pair) stored in TCAM cell. The transistor (MML) 104 is turned on to discharge the match-line (ML) when an input signal mismatch with stored data in TCAM cell. The variable resistances (RSL) 105, (RSLB) 106 are for storing NV-TCAM data.

As noted above, the transistor (MML) 104 is turned on to discharge the match-line (ML) when the input signal mismatch with stored data. Based-on the below table, when such a TCAM cell stores a logic "0" or logic "1", the TCAM cell can provide the same essential match operation as a binary CAM cell. However, when such a TCAM cell stores a "don't care" value (X), the TCAM cell can provide a match result regardless of the compared data value applied to the TCAM cell. In resistive voltage-divider search (approach), the information storing states for variable resistance (RSL) 105 and variable resistance (RSLB) 106 are pairs of high and low resistance states (HRS/LRS, LRS/HRS or HRS/HRS) so that the overall resistance is always high. VDD and Vth indicate a supply voltage and a threshold voltage, respectively, for the transistor (MML) 104.

TABLE

| TCAM | RSL | RSLB | NQ Search "1" | NQ Search "0" | ML Search "1" | ML Search "0" |
|---|---|---|---|---|---|---|
| 0 | HRS | LRS | <Vth | >Vth | VDD | 0 V (mismatch) |
| 1 | LRS | HRS | >Vth | <Vth | 0 V (mismatch) | VDD |
| X | HRS | HRS | <Vth | <Vth | VDD | VDD |

Figure 2:
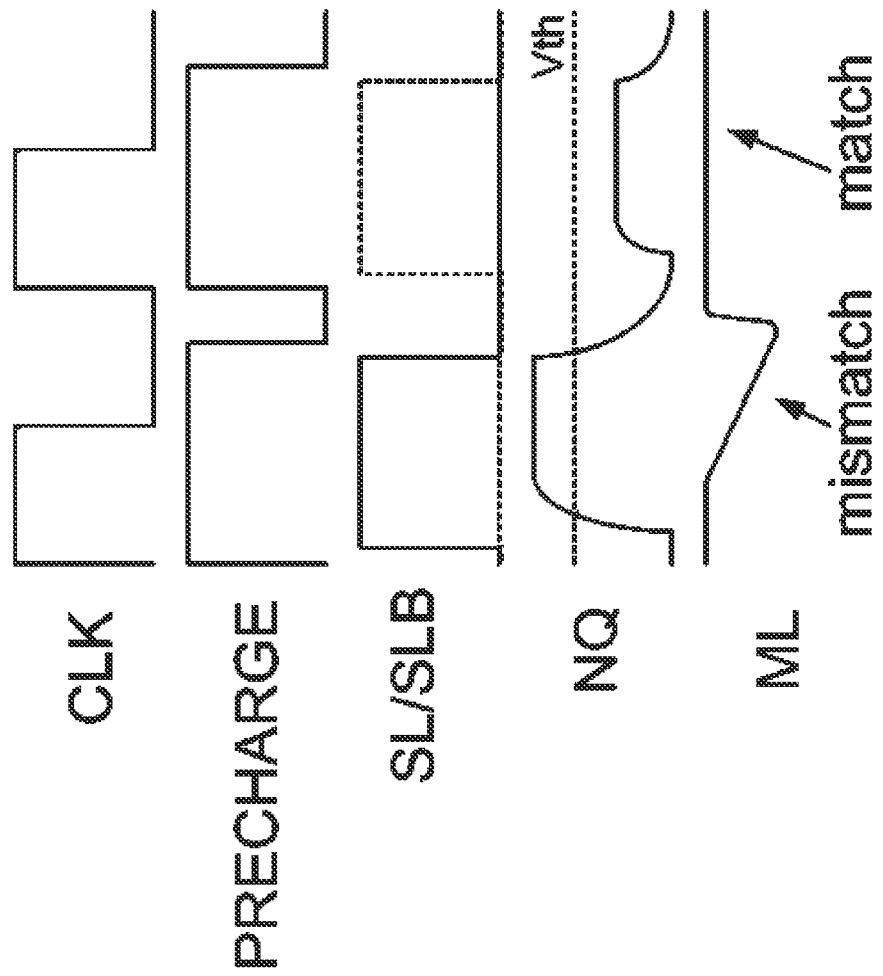
FIG. 2 shows a waveform for search operation of a non-volatile ternary content-addressable memory with resistive memory device (5T2R cell) according to the invention.

FIG. 2 shows a waveform for search operation of a non-volatile ternary content-addressable memory with resistive memory device (5T2R cell) according to the invention. In search operation, it includes a step of applying a pre-charge signal to pre-charge the ML (match line) from a relatively low voltage to a working voltage VDD (supply voltage) in pre-charge period. Meanwhile, internal clock generator circuit (not shown) may receive a clock signal CLK by way of a clock line. If internal clock generator circuit generates a master side clock signal CLKM based on clock signal CLK, then master side clock signal CLKM may have substantially the same frequency as clock signal CLK. The cycle time in pre-charge period is longer than that of the clock signal CLK. Subsequently, a relatively high voltage (potential) is applied to search transistor 100 or 101 via search line (SL) or search line bar (SLB) during one cycle. In one example, cycle time in search line SL (or SLB) applying is also longer than that of the clock signal CLK, but shorter than that of precharge period. In precharge operation, a match line can be precharged to a relatively high potential, while compared data lines are low. In one embodiment, a reference node NQ prior to gate of the match line transistor 104 can be precharged (or maintained) at a potential below that of match line. Then, voltage level at node NQ (V(NQ)) is either relatively high voltage higher than a threshold voltage of the match line transistor 104 (>Vth) or relatively low voltage lower than threshold voltage of the match line transistor 104 (<Vth). For example, voltage level at node NQ (V(NQ)) is relatively high voltage (>Vth) in first cycle, and voltage level at node NQ (V(NQ)) is relatively low voltage (<Vth) in next (second) cycle. Accordingly, when V(NQ) is relatively high voltage (>Vth)), a mismatch occurs; when V(NQ) is relatively low voltage (<Vth), there is a match in this cell. As noted above, the transistor (MML) 104 is turned on to discharge match-line (ML) when an input signal from search line SL (or SLB) mismatch with stored data (V(NQ) is relatively high voltage). The search operation is performed.

Figure 3:
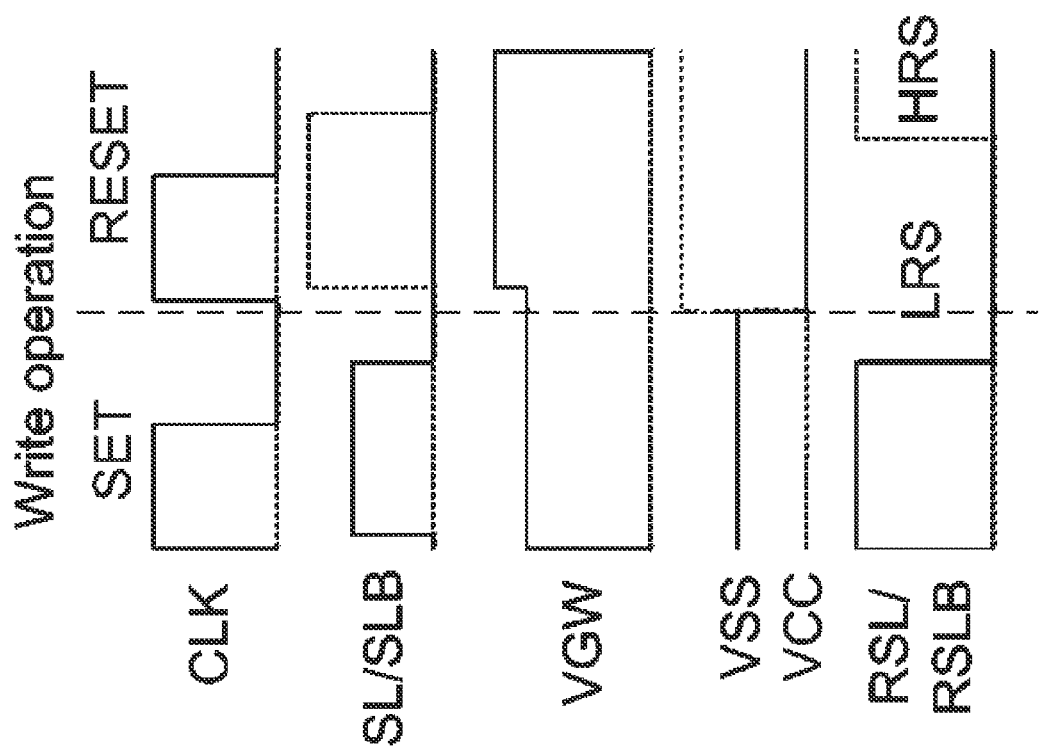
FIG. 3 shows a waveform for write operation of a non-volatile ternary content-addressable memory with resistive memory device (5T2R cell) according to the invention.

FIG. 3 shows a waveform for write operation of a non-volatile ternary content-addressable memory resistive memory device (5T2R cell) according to the invention. It is noted that in the arrangement of FIG. 1, such a write operation can be accomplished in two steps. In first cycle, it is SET operation (write LRS). In SET operation, VCC is zero voltage, VSS is a relatively high voltage; gate voltage for write (VGW) is relatively high level; search line SL (or SLB) being applied for a relatively high voltage. Therefore, in the first cycle, one of the variable resistance (RSL) 105 and the variable resistance (RSLB) 106 is written as LRS. In second cycle, it is RESET operation (write HRS). In RESET operation, VCC is a relatively high voltage, VSS zero voltage; gate voltage for write (VGW) is more than that in SET operation; search line SL (or SLB) being applied for a relatively high voltage more than that in SET operation. Transition between the first cycle and the second cycle depicts at VCC reverse. In the second cycle, variable resistance (RSL) 105 or variable resistance (RSLB) 106 is still in low resistance state (LRS) for a while, followed by transiting into high resistance state (HRS). Therefore, in the second cycle, another of the variable resistance (RSL) 105 and variable resistance (RSLB) 106 is written as HRS.

The above five transistors (MRD, MW, MSL, MSLB, MML) are applied for search operation and read operation (small dimension, low current), switched or opened by write operation, read operation and/or search operation. The variable resistances are facilitated for storing NV-TCAM data. Clock signal of SL/SLB is for resistive voltage-divider search.

The advantages of non-volatile ternary content-addressable memory 5T2R of the invention includes a). achieve 0.4 smaller area compared to conventional 16 T TCAM; b). small area; c). free standby cell leakage; and d). wake up fast.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A non-volatile ternary content-addressable memory with resistive memory device, comprising:

five transistors including a pair of search transistors with a first search transistor and a second search transistor, a read transistor, a write transistor and a match line transistor, wherein a match line is coupled to said match line transistor; and a pair of variable resistances having a first variable resistance and a second variable resistance;

wherein a second terminal of said pair of variable resistances is coupled to one first terminal of three terminals in said read transistor, said write transistor and said match line transistor;

wherein a first terminal of said first variable resistance is coupled to one second terminal of three terminals in said first search transistor and said second search transistor;

the others terminal of three terminals in each transistor of said five transistors connect whether to a voltage source, a control signal or floating.

2. The structure of claim 1, wherein said first terminal of said first variable resistance is coupled to a source electrode of said first search transistor, wherein said source electrode is said one second terminal of three terminals in said first search transistor.

3. The structure of claim 1, wherein said first terminal of said second variable resistance is coupled to a source electrode of said second search transistor, wherein said source electrode is said one second terminal of three terminals in said second search transistor.

4. The structure of claim 1, wherein a drain of said pair of search transistors is coupled to a relatively high voltage.

5. The structure of claim 1, wherein said second terminal of said pair of variable resistances is coupled to a drain electrode of said read transistor, wherein said drain electrode is said one first terminal of three terminals in said read transistor.

6. The structure of claim 1, wherein said second terminal of said pair of variable resistances is coupled to a drain electrode of said write transistor, wherein said drain electrode is said one first terminal of three terminals in said write transistor.

7. The structure of claim 1, wherein said second terminal of said pair of variable resistances is coupled to a gate electrode of said match line transistor, wherein said gate electrode is said one first terminal of three terminals in said read transistor.

8. The structure of claim 1, wherein a source electrode of said read transistor and a source electrode of said write transistor are coupled to a relatively low voltage.

9. A method of search operation for a non-volatile ternary content-addressable memory with resistive memory device, comprising:

applying a precharge signal to pre-charge a match line from a relatively low voltage to a working voltage;

applying a relatively high voltage to one of a pair of search transistors via a search line or search line bar during one cycle; and when a voltage level at a node prior to a gate of a match line transistor is larger than a threshold voltage of said match line transistor, a mismatch is obtained;

when said voltage level at said node prior to said gate of said match line transistor is smaller than said threshold voltage of said match line transistor, a match is obtained;

wherein said match line is coupled to said match line transistor;

wherein a first and a second variable resistance are to provide said node to said gate of said match line transistor, said read transistor and said write transistor.

10. The method of claim 9, wherein said working voltage is VDD.

11. The method of claim 9, wherein said match line transistor is turned on to discharge said match line when said mismatch occurs.

12. The method of claim 9, wherein said match line is coupled to said match line transistor.

13. The method of claim 9, wherein said pair of search transistors is coupled to a pair of variable resistances.

* * * * *